United States Patent [19]

Tsuji

[11] Patent Number: 5,541,432
[45] Date of Patent: Jul. 30, 1996

[54] SILICON ON INSULATOR FIELD EFFECT TRANSISTORS

[75] Inventor: Kazuhiko Tsuji, Nara, Japan

[73] Assignee: Matsushita Electric Industrial Co., Ltd., Osaka, Japan

[21] Appl. No.: 345,438

[22] Filed: Nov. 21, 1994

Related U.S. Application Data

[62] Division of Ser. No. 207,633, Mar. 9, 1994, Pat. No. 5,409,850, which is a division of Ser. No. 87,464, Jul. 8, 1993, Pat. No. 5,315,143, which is a division of Ser. No. 874,835, Apr. 28, 1992, abandoned.

[51] Int. Cl.$^6$ ............................. H01L 27/01; H01L 27/12
[52] U.S. Cl. .............................................. 257/350; 257/351
[58] Field of Search ...................................... 257/351, 350, 257/347, 352, 365, 369, 348

[56] References Cited

U.S. PATENT DOCUMENTS

| | | | |
|---|---|---|---|
| 4,523,213 | 6/1985 | Konaka et al. | 257/347 |
| 4,996,574 | 2/1991 | Shirasaki | 257/347 |
| 5,095,347 | 3/1992 | Kirsch | 257/347 |
| 5,315,143 | 5/1994 | Tsuji | 257/351 |

FOREIGN PATENT DOCUMENTS

| | | | |
|---|---|---|---|
| 1-194437 | 8/1989 | Japan | 257/347 |
| 3-108766 | 5/1991 | Japan | 257/347 |

*Primary Examiner*—Wael M. Fahmy
*Attorney, Agent, or Firm*—McDermott, Will & Emery

[57] ABSTRACT

In a MOS type semiconductor device, a source region, a channel region and a drain region of a MOS type device are arranged on the same plane, while a gate electrode is also arranged on the same plane adjacent to the channel region. Another set of a source region, a channel region, and a drain region may also be arranged on the same plane, and the latter MOS device is arranged adjacent to the gate electrode. This type of device may be constructed as a CMOS type device. In another type of semiconductor device, the above-mentioned type plane arrangement of the source, channel, and drain regions are layered via an insulator layer, while a gate electrode is provided vertically so as to be adjacent to the two channel regions.

4 Claims, 15 Drawing Sheets

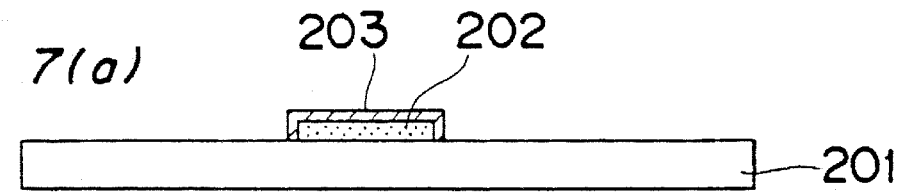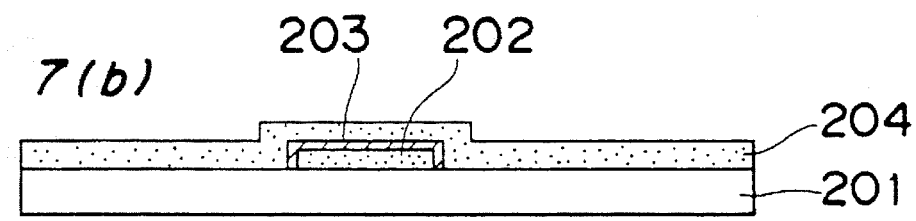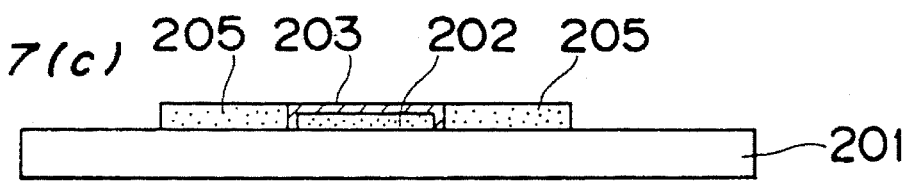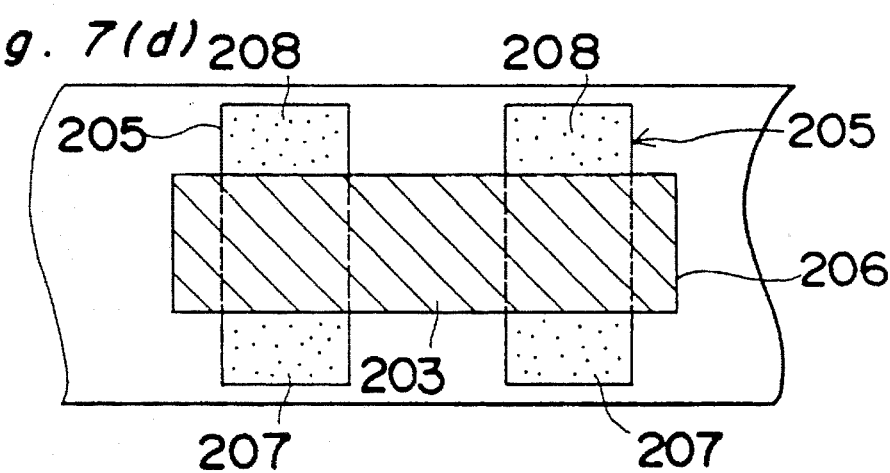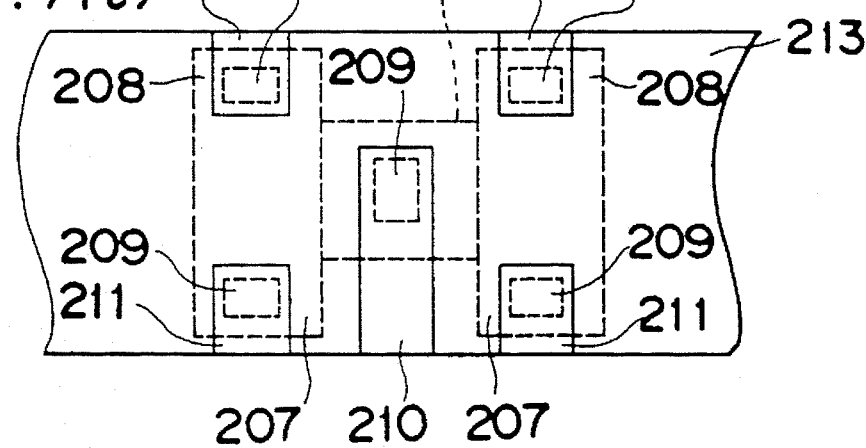

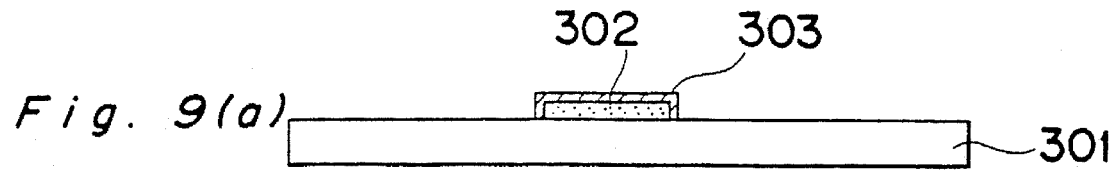
Fig. 9(a)
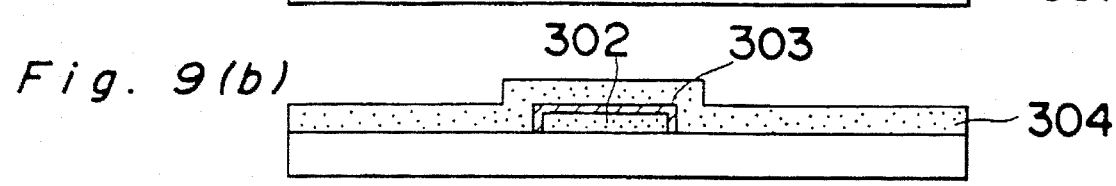
Fig. 9(b)
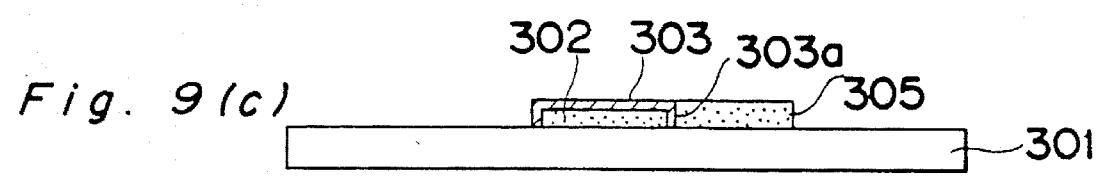
Fig. 9(c)
Fig. 9(d)
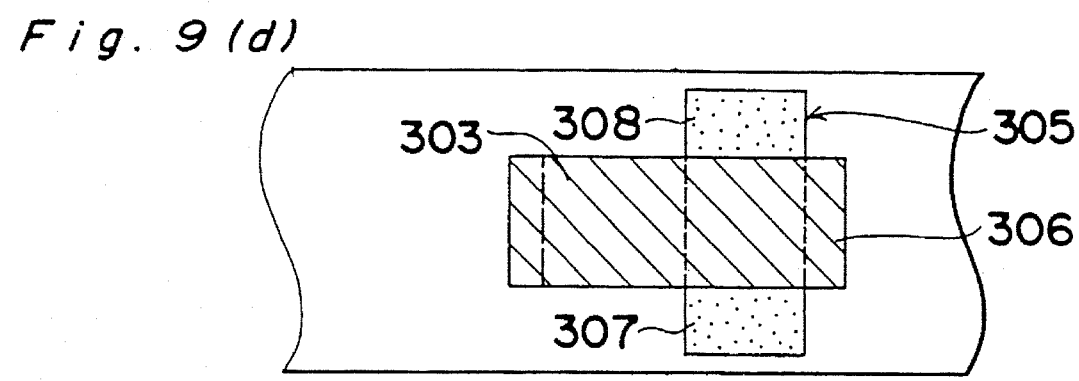
Fig. 9(e)
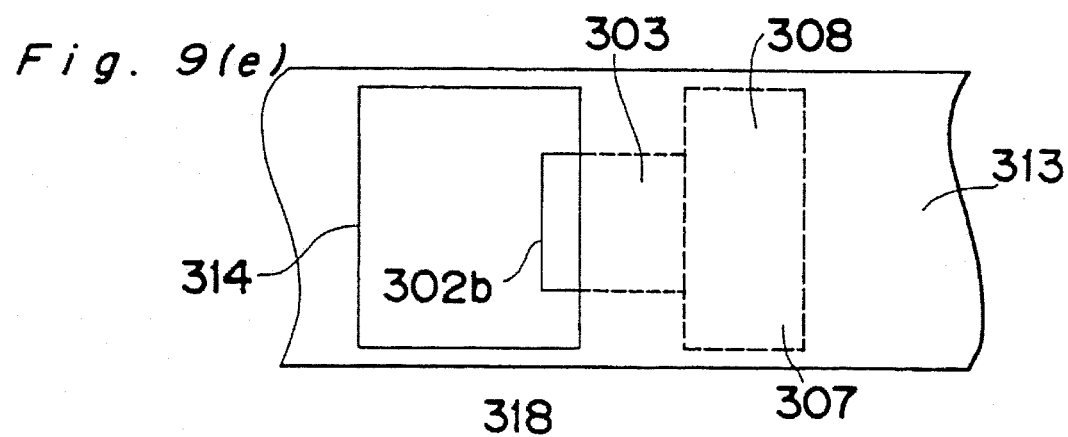
Fig. 9(f)
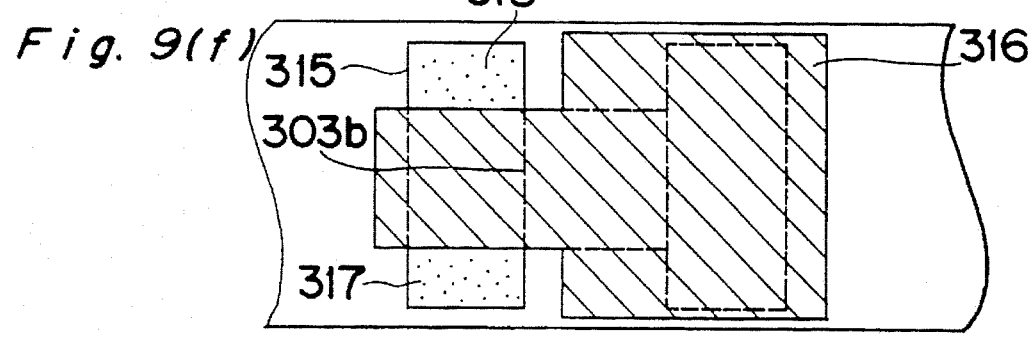

SILICON ON INSULATOR FIELD EFFECT TRANSISTORS

This is a divisional of application Ser. No. 08/207,633, filed Mar. 9, 1994, now abandoned U.S. Pat. No. 5,409,850 which is a divisional of application Ser. No. 08/087,464, filed Jul. 8, 1993, now U.S. Pat. No. 5,315,143 which is a divisional of application Ser. No. 07/874,835, filed Apr. 28, 1992 now abandoned.

BACKGROUND OF THE INVENTION

1. Field of the Invention

The present invention relates to a semiconductor device which can be integrated at a high density and a manufacturing method thereof.

2. Description of the Prior Art

As shown in FIG. 1(a), in a first prior art MOS type semiconductor device, a gate oxide film 922 and a gate electrode 923 are formed successively on a semiconductor substrate 921 of a conduction type, and a source region 924 and a drain region 925 are formed by implanting impurity ions into the semiconductor substrate 921 with use of the gate electrode 923 as a mask. Then, as shown in FIG. 1(b), an insulating film 926 is formed on the whole surface, and openings 927, 928, 929 for contact are formed in the insulating film 926 and gate oxide film 922 selectively and metalization layers 930, 931, 932 are formed. On the other hand, in another prior art semiconductor device shown in FIG. 2, in order to decrease the capacitance due to a substrate, a p-type semiconductor film 912 is formed on an electrical insulator film 911. Then, an n-type source region 913 and an n-type drain region 914 are formed in the semiconductor film 912, and a gate oxide film 915 and a gate electrode 916 are formed successively on a channel region interposed between the two regions 913 and 914. An insulating film (not shown) is formed next on the whole surface, and openings (not shown) are formed in the insulating film for contact with the source and drain regions 913, 914 and with the gate electrode 916. Finally, metalization layers (not shown) for contact are formed to complete a semiconductor device.

In the prior art MOS semiconductor device structures, the gate oxide film 922, 915 the gate electrode 923, 916 and the metalization layers 930, 931, 932 are formed above the semiconductor substrate 921,911. Therefore, the surface under the metalization layer is uneven largely unevenly, and the metalization layer is liable to be broken. And, when it is demanded to decrease the pattern size, the thicknesses of the layers composing the device have to be decreased in order to prevent the breakage of line due to the large aspect ratio of a longitudinal length to a lateral length of the openings. Further, if the thicknesses of the gate electrode 923, 916 and of the metalization layers 930, 931, 932 are decreased, the resistances increase and the electrical characteristics become worse.

FIG. 3 shows a prior art complementary MOS (CMOS) device, which is manufactured as follows: In a semiconductor substrate 941 of a first conduction type for example p-type, a well layer 942 of a second conduction type different from the first one, that is n-type, is formed. Then, after a gate oxide film 943 is formed on the semiconductor substrate 941, a polycrystalline semiconductor film is formed on the gate oxide film 943, and gate electrodes 944a, 944b are formed from the polycrystalline semiconductor film with a photolithography process. Next, by using the gate electrode pattern 944a as a mask, impurity atoms of the second conduction type, n-type are diffused into the semiconductor substrate 941 to form source and drain areas 945 of the second conduction type. On the other hand, in the well layer 942 of the second conduction type, source and drain regions 946 of the first conduction type different from that of the well layer 942 are formed with use of the gate electrode 944b as a mask.

The obtained CMOS type semiconductor device comprises a transistor X of the second conduction type, including the source and drain regions 945 of the second conduction type, the gate oxide film 943 and the gate electrode 944a, and a transistor Y of the first conduction type, including the source and drain regions 946 of the first conduction type, the gate oxide film 943 and the gate electrode 944b.

Such a CMOS type device needs to provide a region for forming a transistor Y of a conduction type and another region for forming a transistor X of the other conduction type in the same plane of a semiconductor substrate. Therefore, it is hard to manufacture such a CMOS type device integrated at a higher density.

SUMMARY OF THE INVENTION

An objective of the present invention is to provide a semiconductor device which can be manufactured with integration at a large density and a manufacturing method thereof.

In a semiconductor device according to the present invention, a source region, a channel region, and a drain region of a MOS device are arranged in a plane, and a gate electrode is also arranged in the same plane adjacent to the channel region. Further, another set of a source region, a channel region, and a drain region may also be arranged on the same plane and is arranged near the same gate electrode. This type of device may also be constructed as a CMOS type device. Further, the semiconductor device according to the present invention is constructed by layering the above-mentioned planar arrangements of the source, channel, and drain regions with use of an insulator layer interposed between substrates. In these devices, a gate electrode is provided vertically so as to be adjacent to the two channel regions.

An advantage of the present invention is to provide a semiconductor device of a high density, that is, the very narrow channel and gate regions, because the gate is composed vertically to the substrate.

Another advantage of the present invention is to provide a semiconductor device wherein a metalization layer is hard to break.

BRIEF DESCRIPTION OF THE DRAWINGS

Other objectives and features of the present invention will become clear from the following description taken in conjunction with the preferred embodiments thereof with reference to the accompanying drawings, and in which:

FIGS. 7(a)–(c) and (d)–(e) are cross-sectional views and plan views showing a manufacturing method of a semiconductor device of Embodiment 3 of the present invention;

FIGS. 9(a)–(c) and (d)–(f) are cross-sectional views and plan views showing a manufacturing method of a semiconductor device of Embodiment 4 of the present invention;

DETAILED DESCRIPTION OF THE PREFERRED EMBODIMENTS

Figure 1A:
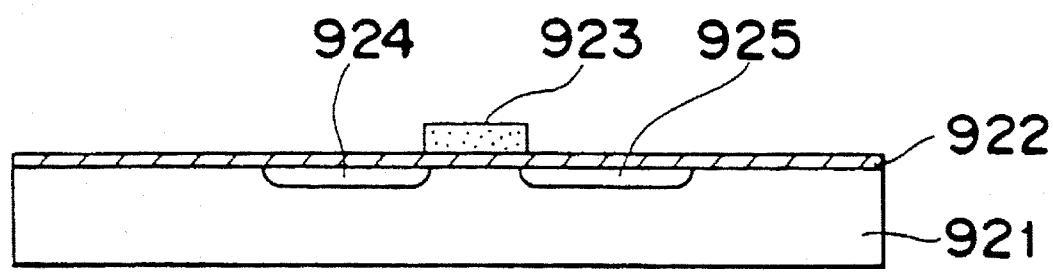
FIGS. 1(a) and (b) are cross-sectional views of a prior are semiconductor device.
Figure 1B:
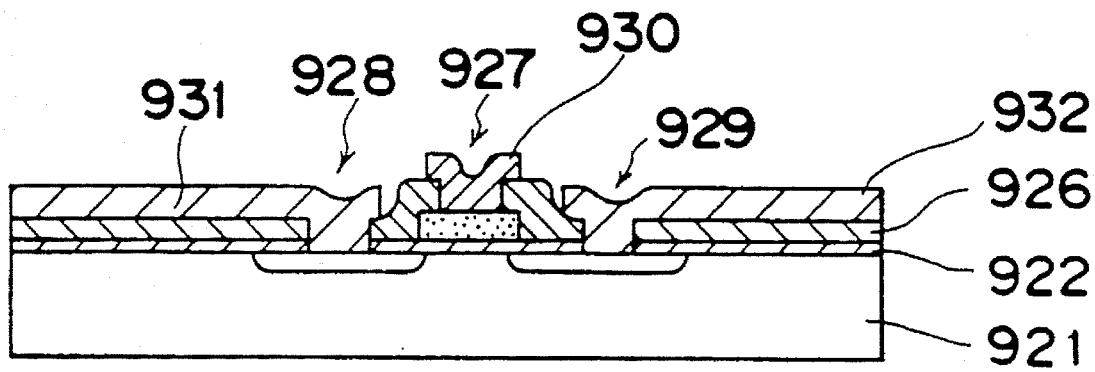
Figure 2:
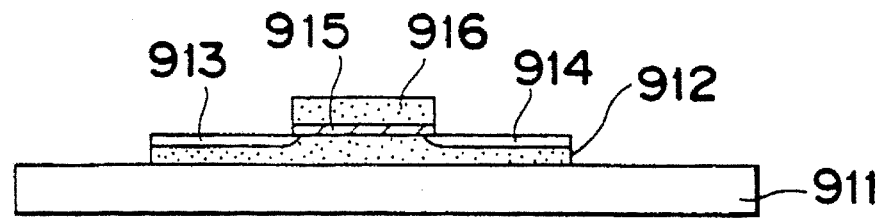
FIG. 2 is a cross-sectional view of another prior are semiconductor device.
Figure 3:
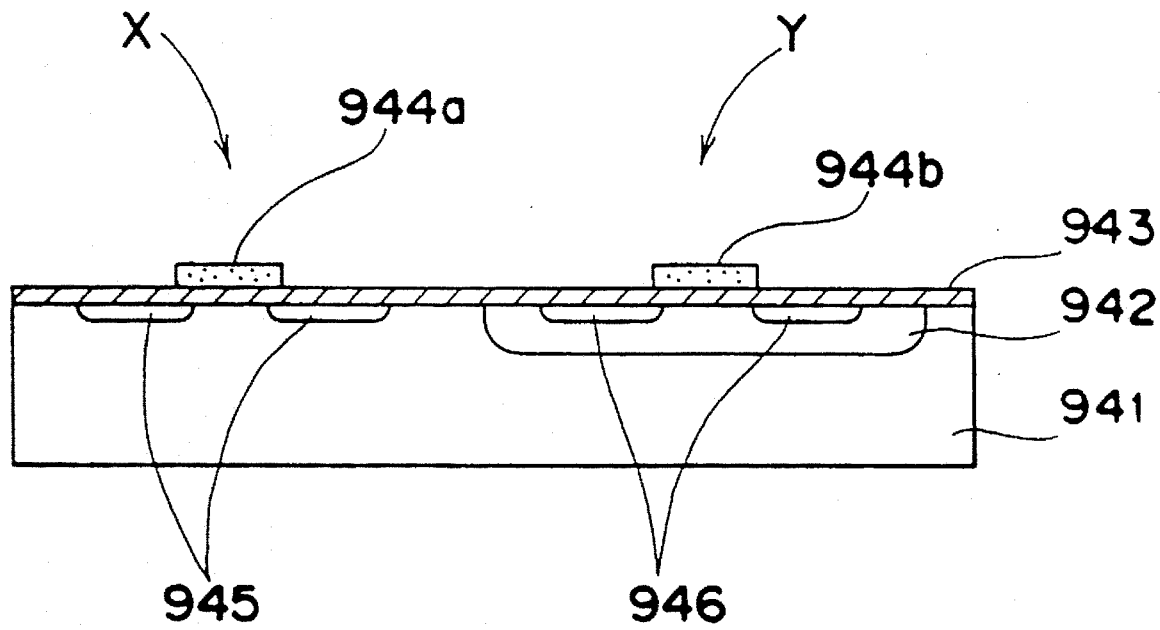
FIG. 3 is a cross-sectional view of a prior are CMOS device.

Embodiments of the present invention will be explained below with reference to drawings, wherein like reference characters designate like or corresponding parts throughout the several views.

Figure 4A:
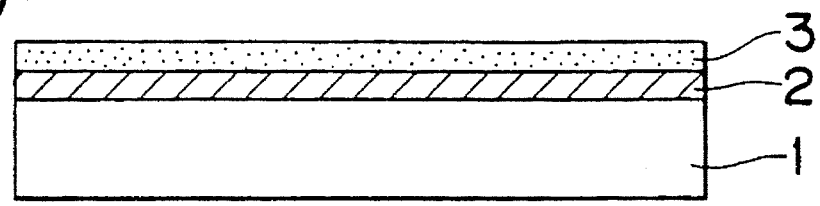
FIGS. 4(a)–(d) and (e)–(f) are cross-sectional views and plea views showings a manufacturing method of a semiconductor device of Embodiment 1 of the present invention.
Figure 4B:
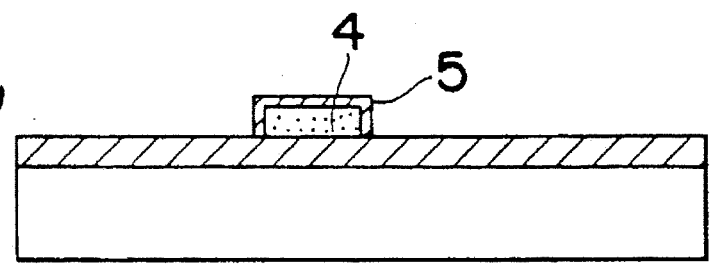
Figure 4C:
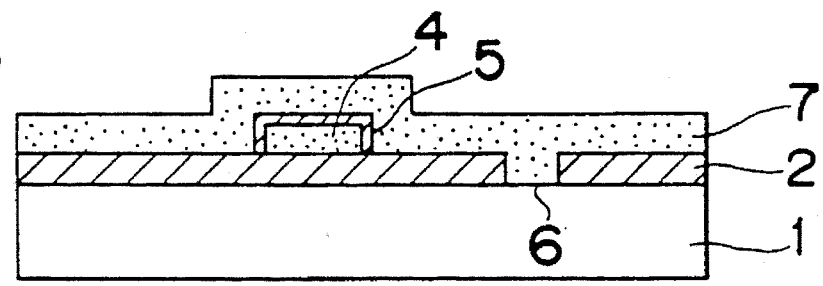
Figure 4D:
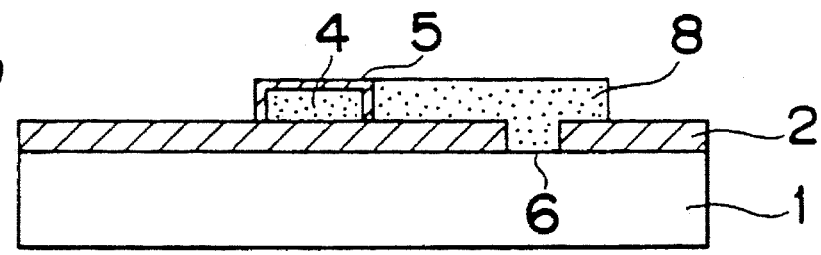

FIGS. 4(a)–(f) illustrate a manufacturing method of a semiconductor device of Embodiment 1. In FIG. 4(a), an electrical insulator film 2 of silicon dioxide or the like is formed on a semiconductor substrate 1 of a p-type, boron doped, conduction type, and a first polycrystalline film 3 is formed on the whole surface of the insulator film 2. Next, a prescribed first pattern 4 is formed on the first polycrystalline silicon film 3 as a gate electrode, and the polycrystalline silicon film of the first pattern 4 is oxidized to form a gate oxide film 5 (FIG. 4(b)). Next, an opening 6 is formed in an area of the insulator film 2 not covered with the first pattern 4 of the first polycrystalline film. Then, a second polycrystalline silicon film 7 is applied to the whole surface (FIG. 4(c)). Next, the second polycrystalline silicon film 7 is irradiated with a laser beam or the like to make it monocrystalline. Then, a second pattern 8 of the second polycrystalline silicon film is formed in a position adjacent to the gate oxide film 5 in a side wall of the first pattern 4 of the first polycrystalline silicon film, covering the opening 6 (FIG. 4(d)).

Figure 4E:
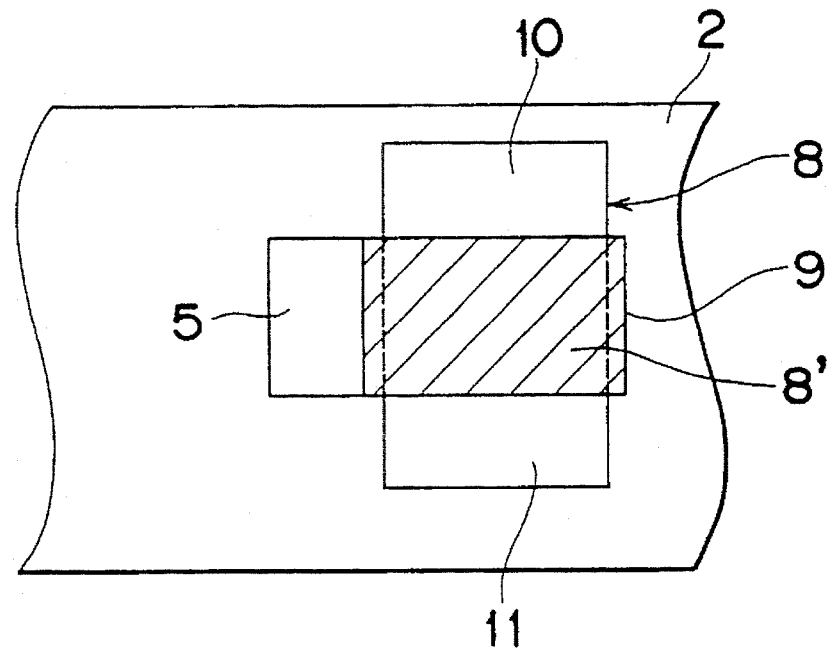
Figure 4F:
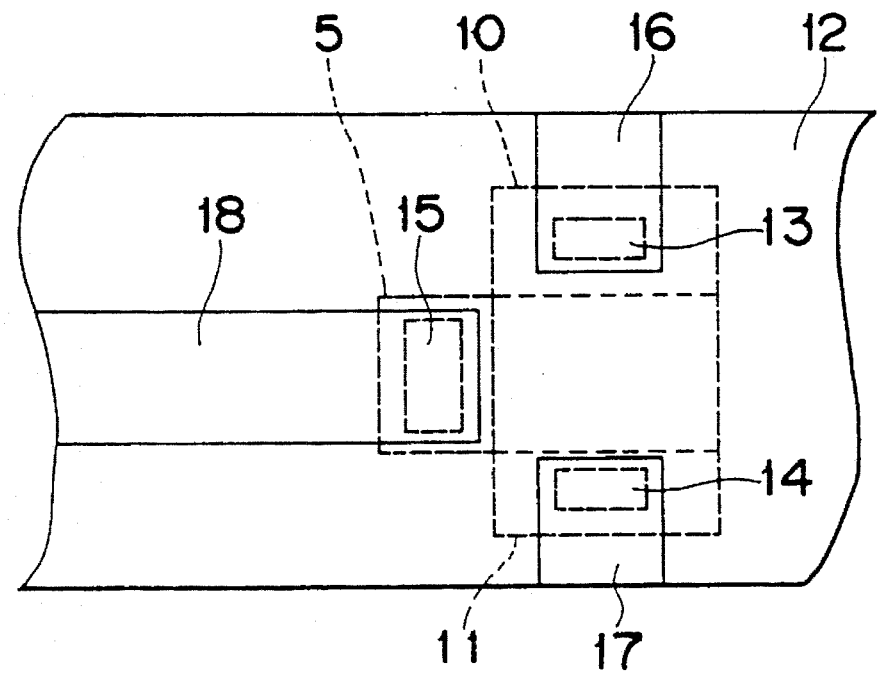

Referring now to FIG. 4(e), next a photoresist film 9 is formed on the second pattern 8 of monocrystalline silicon film and on a part of the gate insulator film 5. Next, by using the photoresist film 9 as a mask, n-type impurity ions, phosphorus or arsenic ions, are implanted into the second pattern 8 to form source and drain regions 10, 11 (FIG. 4(e)). A region 8' between the source and drain regions 10, 11 is a channel region. Next, after the photoresist film 9 is removed, a second insulator film 12 is applied to the whole surface and openings 13, 14, 15 for the source, drain and gate regions are formed selectively and metalization layers 16, 17, 18 are formed (FIG. 4(f)).

Figure 5:
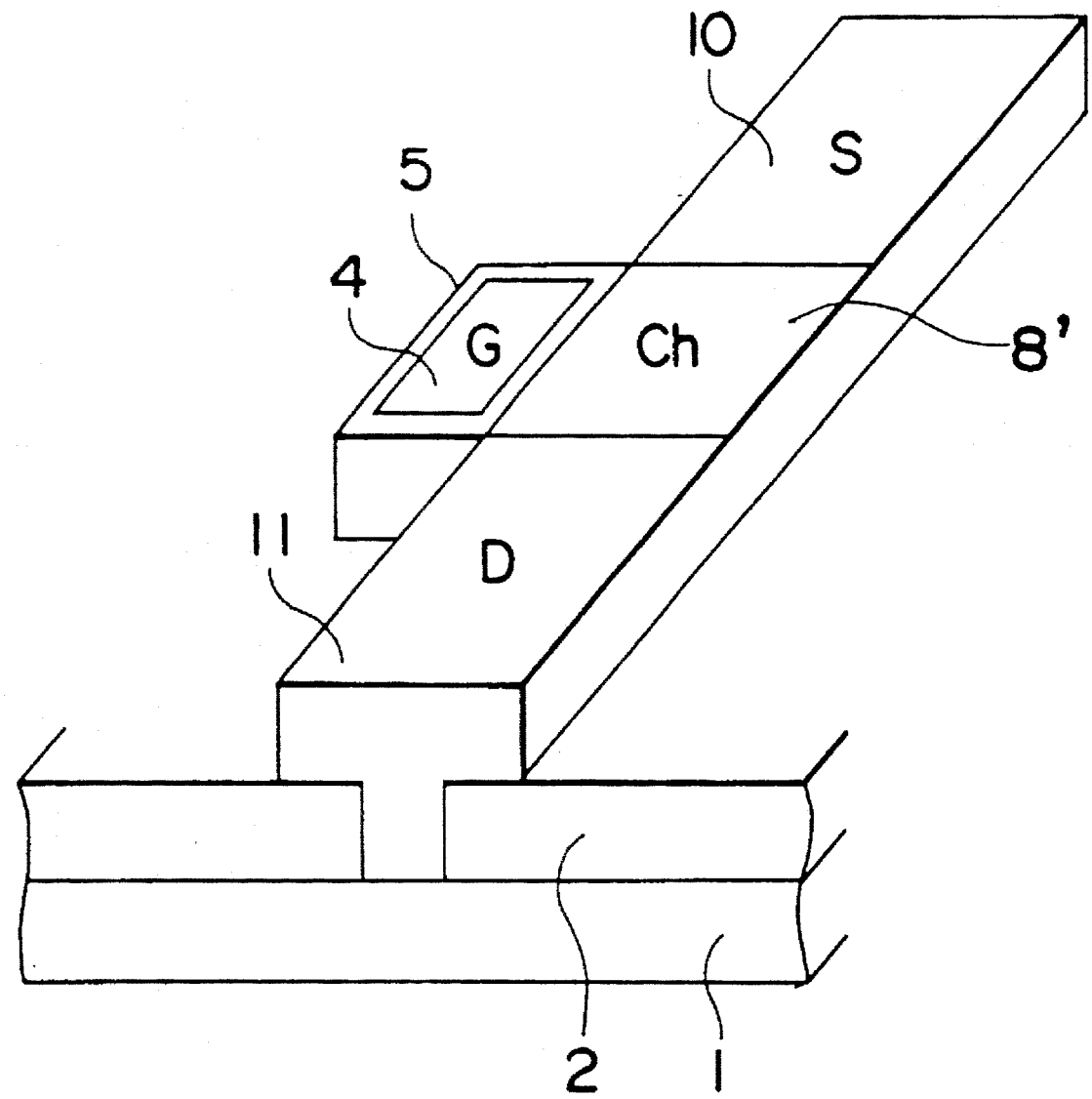
FIG. 5 is a schematic perspective view of the structure of a MOS transistor manufactured as illustrated in FIGS. 4(a)–(f)

FIG. 5 shows the structure of a MOS transistor manufactured as explained above schematically. The MOS type semiconductor includes a gate electrode (G) 4, a source region (S) 10, a drain region (D) 11 and a channel region (Ch) 8', and it should to be noted that all are formed on the same plane of the insulator film 2. The gate electrode 4 is located not above the channel region 8', but adjacent literally to the channel region 8' via the gate oxide film 5. Therefore, the current flows between the source and drain regions 10, 11 in parallel to the side of the channel region 8' adjacent to the gate electrode 4.

FIGS. 6(a)–(e) illustrate a manufacturing method of a semiconductor device of Embodiment 2. First, an insulator film 121 of silicon dioxide or the like is formed on a semiconductor substrate 120 of a p or n-type conduction type, and an opening 122 is formed selectively in the insulator film 121 to expose the semiconductor substrate 120. Further, a polycrystalline film 123 is applied to the whole surface, and it is radiated with a laser beam to be transformed into a monocrystalline film (FIG. 6(a)). Next, a prescribed first pattern 124 covering an opening 122 of the monocrystalline silicon film 123 is formed, and a gate oxide film 125 is formed on the pattern 124 of the monocrystalline film or the like (FIG. 6(b)). Then, a polycrystalline silicon film is formed on the whole surface, and a second pattern 126 is formed as a gate electrode so as to be connected to the gate oxide film 125 formed at a side wall portion (FIG. 6(c)).

Figure 6A:
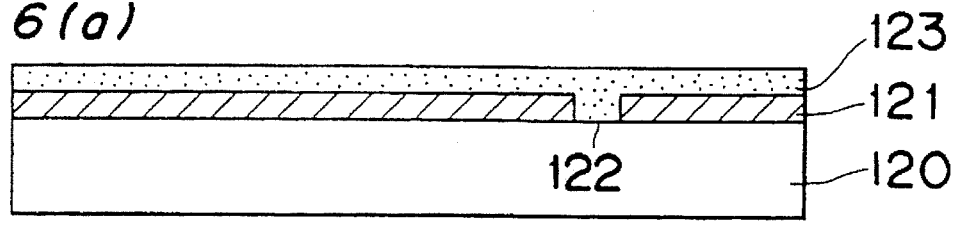
FIGS. 6(a)–(c) and (d)–(e) are cross-sectional views and plan views showing a manufacturing method of a semiconductor device of Embodiment 2 of the present invention.
Figure 6B:
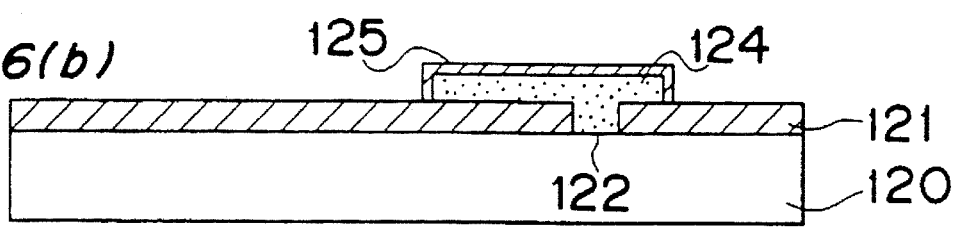
Figure 6C:
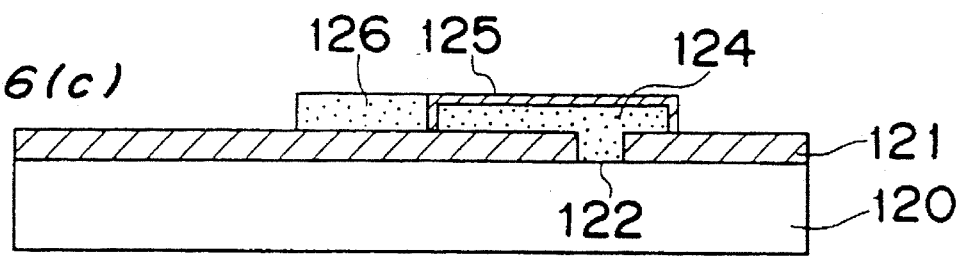
Figure 6D:
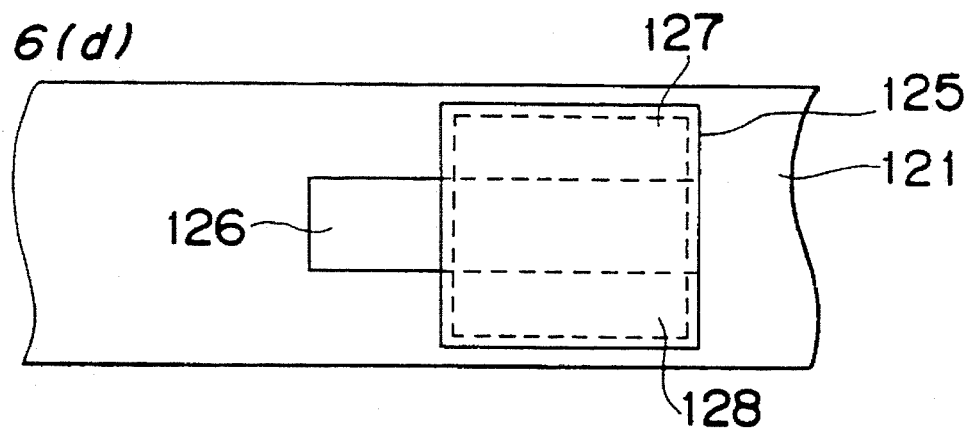
Figure 6E:
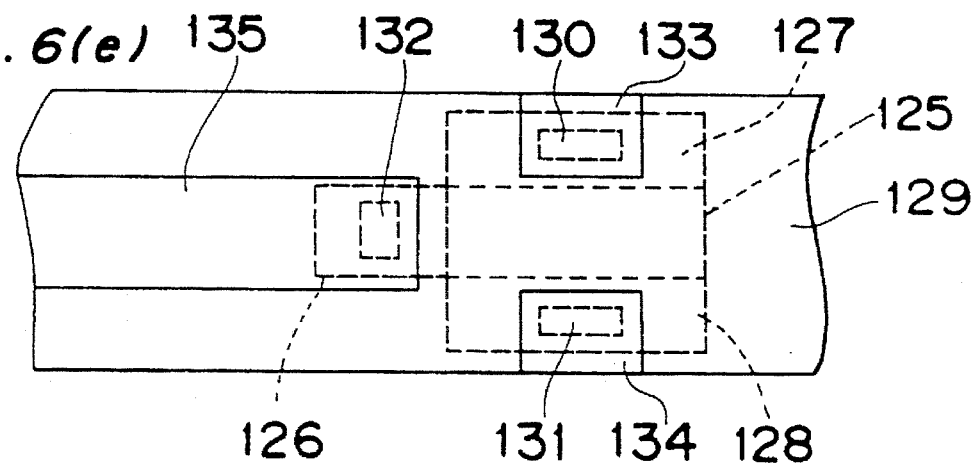

Next, impurity ions are injected selectively in the first pattern 124 of monocrystalline silicon film to form source and drain regions 127, 128 (FIG. 6(d)). Next, an insulator film 129 is formed on the whole surface, and openings 130, 131, 132 are formed in the insulator film 129 selectively. Then, metalization layers 133, 134, and 135 are formed (FIG. 6(e)). Thus, a MOS type semiconductor device is obtained which has a gate electrode, source and drain regions and a channel region all formed on the same plane of the insulator film 121 in FIG. 6(a).

In the above-mentioned structures of FIGS. 4–6, a gate electrode, a gate oxide film, a channel region and source and drain regions are formed on the same plane of an insulator film formed on a semiconductor substrate. Therefore, the heights of the gate electrode and the source and drain electrodes can be equalized to each other in contrast to a prior art device. Thus, after a thin insulator film is formed on the whole surface, the openings of the same size can be formed for all regions. Therefore, the aspect ratio of the opening for connecting the metalization layer to the gate electrode and to the source and drain electrodes becomes the same. Further, the unevenness of the ground plane does not exist, narrow metalization layers which are hard to break can be formed easily.

Because the gate electrode is located vertically at a side wall of silicon-based regions of source, channel, and drain, the density of MOS transistors can be increased.

Further, because the surface is flat, a semiconductor for device of a multi-layer structure can be easily manufactured.

FIGS. 7(a)–(e) illustrate a manufacturing method of a semiconductor device of Embodiment 3. First, as shown in a sectional view of FIG. 7(a), a first semiconductor layer is applied to an insulator film 201, and a prescribed first pattern 202 of the first layer is formed as a gate electrode on the insulator film 201. Then, a gate oxide film 203 is formed with a thermal oxidization ion process or the like on the sides and the surface of the semiconductor film (FIG. 7(a)). Next, a second semiconductor film 204 of a p-type conduction type is applied to the whole surface (FIG. 7(b)). Then, two prescribed second patterns 205 of the semiconductor film 204 are formed, each connected to a side of the gate oxide 203 covering the first pattern 202 (FIG. 7(c)).

Next, as shown in a top plan view of FIG. 7(d), a photoresist film 206 of a pattern which intersects the first pattern 202 as a gate electrode is formed over the two second patterns 205 and the gate oxide film 203. Then, by using the photoresist resin film 206 as a mask for ion implantation, impurity ions of a n-type conduction type opposite to the first one are implanted in prescribed regions in the second patterns 205 to form source and drain regions 207, 208 (FIG. 7(d)). In the structure of a MOS transistor of this Embodiment, the second patterns 205 exist on the same surface with the gate electrode 202. Therefore, the ion implantation can be performed easily. Thus, the source and drain regions 207, 208 are formed at the two sides of a region covered by the photoresist film 206. The region 205' (not shown) of the second pattern 205 between the source and drain regions 207, 208 forms a channel region. It is to be noted that a set of the source, channel and drain regions is formed in each sides of the gate electrode 202. Next, after the photoresist resin film 206 is removed, an insulator film 213 is applied to the whole surface and openings 209 are formed on the gate electrode 202 and the source and drain regions 207, 208. Further, after a metallic layer is formed on the whole surface, prescribed patterns of the metallic layer are formed to obtain a metalization layer 210 of the gate electrode 202 and metalization layers 211, 212 of the source and drain regions 207, 208 (FIG. 7(e)).

Figure 8:
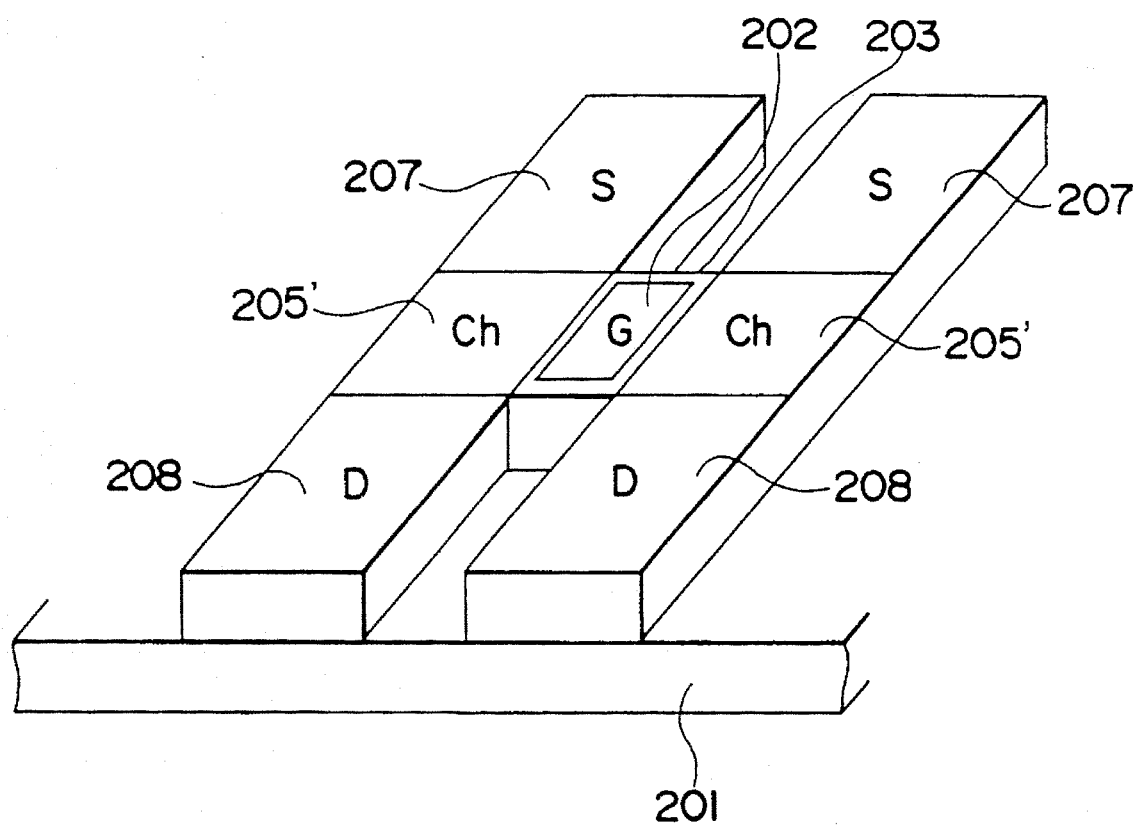
FIG. 8 is a schematic perspective view of the structure of a MOS transistor manufactured as illustrated in FIGS. 7(a)–(e)

FIG. 8 shows the structure of a MOS transistor manufactured as explained above schematically. The MOS type semiconductor includes a gate electrode (G) 202, source regions (S) 207, drain regions (D) 208 and channel regions (Ch) 205', and it is to be noted that all are formed on the same plane of the insulator film 201. The gate electrode 202 is located adjacent to the channel region 205' via a gate oxide fill 203. The one gate electrode for the two MOS transistors may be manufactured simultaneously.

It is to be noted that channel regions 205' are formed on the two sides of a gate electrode 202. Therefore, MOS type semiconductors can be controlled by the same gate electrode 202. The width between the gate electrodes 202 can be made narrower.

FIGS. 9(a)–(f) illustrate a manufacturing method of a CMOS semiconductor device of Embodiment 4. In a cross-sectional view of FIG. 9(a), a first semiconductor layer is formed on an insulator film 301, and a prescribed first pattern 302 of the semiconductor layer is formed as a gate electrode on the insulator film 301. Then, a gate oxide film 303 is formed on the sides and the top surface of the semiconductor film 302 with a thermal oxidization process or the like (FIG. 9(a)). Next, a second semiconductor film 304 of a first conduction type is applied to the whole surface (FIG. 9(b)). Then, a prescribed second pattern 305 of the semiconductor film 304 are formed adjacent to a side wall 303a of the gate oxide film 303 (FIG. 9(c)).

Next, as shown in a top plan view of FIG. 9(d), a photoresist resin film 306 of a pattern which intersects the first pattern 302 is formed. Then, by using the photoresist film 306 as a mask for ion implantation, impurity ions of a second conduction type opposite to the first one are implanted in prescribed regions in the second pattern 305 to form source and drain regions 307, 308 (FIG. 9(d)). That is, the source and drain regions 307, 308 are formed at the two sides of a region covered by the photoresist film 306. Further, a channel region is formed between the source and drain regions 307, 308. Next, after the photoresist film 306 is removed, an insulator film 313 is applied to the whole surface and an Opening 314 are formed selectively to expose another side wall 302b of the gate electrode 302 (FIG. 9(e)). Next, a gate oxide film 303b is formed on the exposed side wall 302b. Then, after a semiconductor film of a second conduction type opposite to the first one is formed on the whole surface, a third pattern 315 of the semiconductor film is formed so as to be connected via the side wall 303b of the gate oxide film to the gate electrode 302 in the opening 314. Next, a photoresist film 316 of a pattern which intersects the third pattern 305 and covers the first and second pattern 315, 303 is formed, as shown in FIG. 9(f). Then, by using the photoresist film 316 as am ask for ion implantation, impurity ions of the first conduction type are implanted in prescribed regions in the third patterns 315 of the second conduction type to form source and drain regions 317, 318 (FIG. 9(f)). It is to be noted that a set of the source, channel and drain regions is formed in each side of the gate electrode 302. Next, after the photoresist film 316 is removed, an insulator film (not shown) is applied to the whole surface as in Embodiment 3. Then, similarly to FIG. 7(e), openings are formed selectively, and after a metallic layer is formed, metalization patterns are formed.

Thus, a structure similar to FIG. 8 is obtained. That is, a semiconductor device comprises a gate electrode 302, a gate oxide film 303, a channel region and source and drain regions 307, 308 formed on the same plane. But the conduction types of two MOS transistors are different from each other. That is, this embodiment shows a CMOS semiconductor device with the same gate electrode.

Figure 10A:
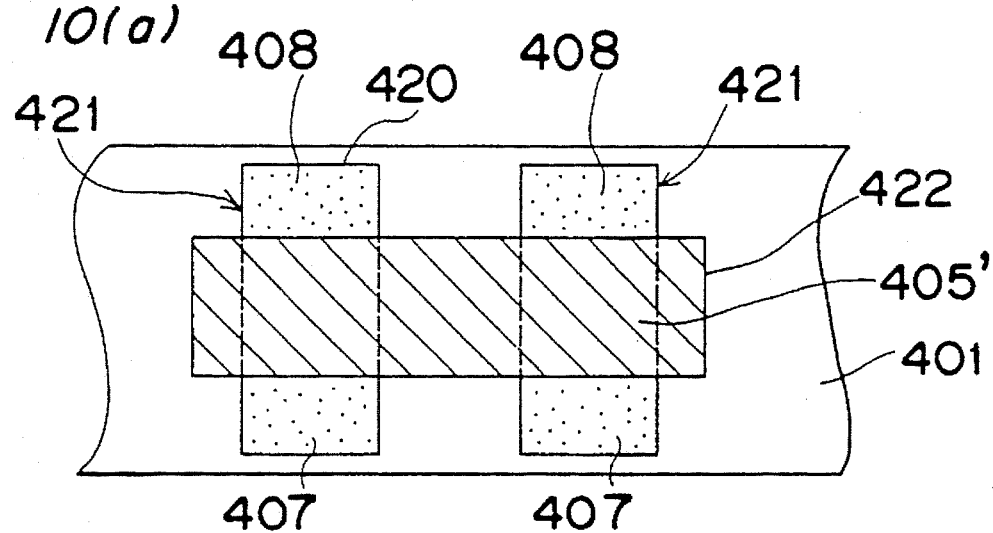
FIGS. 10(a)–(c) are plan views for explaining a manufacturing method of a semiconductor device of Embodiment 5.
Figure 10B:
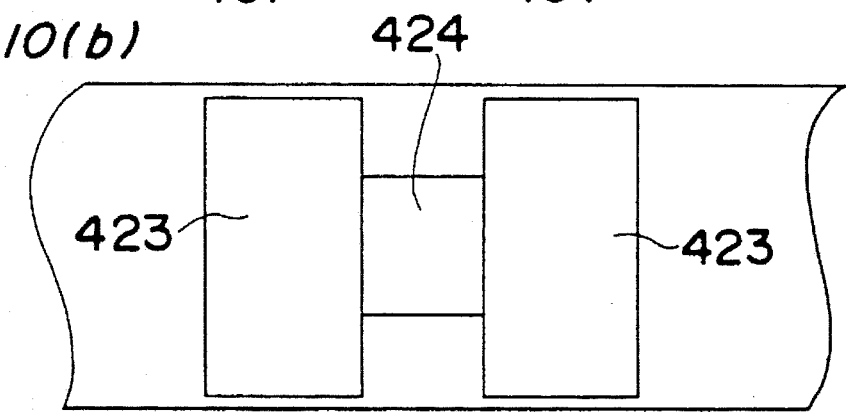
Figure 10C:
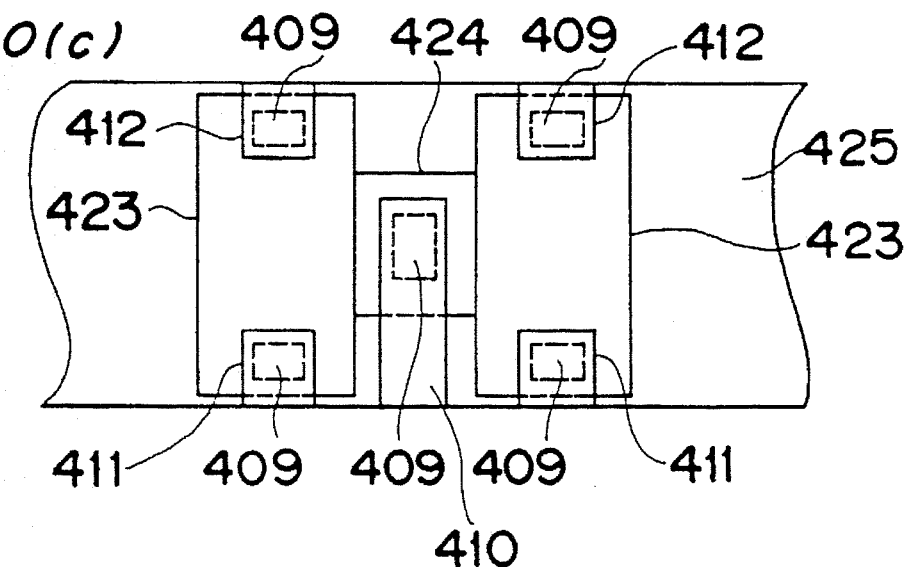

FIGS. 10(a)–(c) illustrate a manufacturing method of Embodiment 5 according to the present invention. First, a semiconductor film is formed on an insulator film 401, and prescribed patterns 420, 421 of the semiconductor film are formed. Next, a photoresist film 422 of a pattern which intersects the patterns 420, 421 is formed. Then, by using the photosensitive resin film 422 as am ask for ion implantation, impurity ions are implanted in prescribed regions in the patterns 420, 421 to form source and drain regions 407, 408 (FIG. 10(a)). Next, after the photoresist film 422 is removed, gate oxide films 423 are formed to cover the two patterns 420, 421. Then, a second semiconductor film 424 which connects the two patterns 420, 421 via the gate oxide films 423 is formed as gate electrodes (FIG. 10(b)). Next, an insulator film 425 is formed on the whole surface as in Embodiment 3, and openings 409 are formed selectively on the gate electrode 424 and on the source and drain regions 407, 408. Further, metalization films 410, 411, and 412 are formed selectively (FIG. 10(c)).

Thus, a structure similar to FIG. 8 is obtained. That is, a semiconductor device comprises a gate electrode 424, a gate oxide film 423, source and drain regions 407, 408, and a channel region between the source and drain regions are formed on the same plane.

In the above-mentioned structures of FIGS. 7–10, a gate electrode, la gate oxide film, channel regions and source and drain regions are formed on the same plane, so that the heights of the gate electrode and the source and drain electrodes can be equalized to each other in contrast to a prior art device. Therefore, the unevenness on the surface can be decreased, metalization layers can be formed easily and the connection of semiconductor elements can be formed easily. And, the gate electrode is located vertically at a side wall of silicon-based regions of source, channel and drain, and the density of MOS transistors in a device, especially in a CMOS device, can be increased.

Further, because the surface is flat, a semiconductor device of a multi-layer structure can be easily manufactured.

It is to be noted that because channel regions are formed on the two sides of a gate electrode, two MOS type semiconductors can be driven by the same gate electrode.

Figure 11:
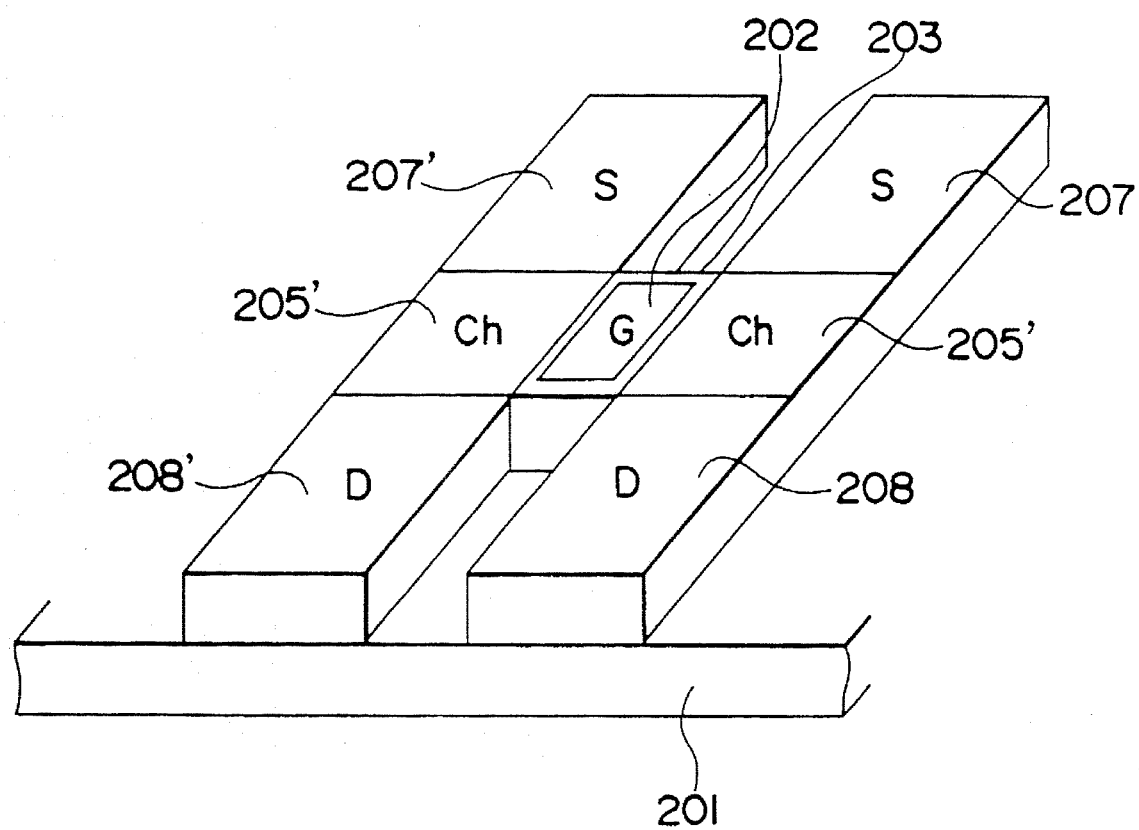
FIG. 11 is a schematic perspective view of the structure of a MOS transistor manufactured as illustrated in FIGS. 10(a)–(c)

This is advantageous for constructing a complementary MOS type semiconductor device. In this case, as shown in FIG. 11, the conduction type of the source region 207' and the drain region 208' is selected to be different from that of the source region 207 and the source region 208. As explained in a conventional method, if a CMOS device is formed on a semiconductor substrate, a well layer is formed in the semiconductor substrate, and a n-type source and drain regions are formed in the substrate, and a p-type source and drain regions are formed in the well layer. The metalization layers are fabricated so as to form a CMOS transistor from the regions. In this structure, channel regions are not below a gate electrode, and ion implantation technique can be conducted easily.

The gate electrodes of the p- and n-channel transistors may be manufactured connected to each other, but separately. Because the two MOS transisters of the p- and n-channel transistors can be formed in an opening on the same plane the common gate electrodes is formed easily. The width between the gate electrodes 203 can be made narrower.

Figure 12A:
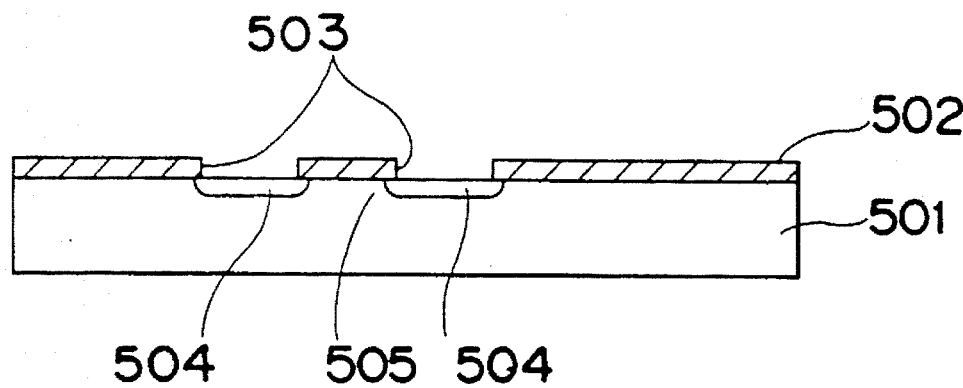
FIGS. 12(a)–(b) and (c)–(d) are cross-sectional views and plan views showing a manufacturing method of a semiconductor device of Embodiment 6.

FIGS. 12(a)-(d) illustrate a manufacturing method of a semiconductor device of Embodiment 6. As shown in FIG. 12(a), a first oxide film 502 is formed on a semiconductor substrate 501 of a first conduction type (for example p-type). Then, two openings 503 are formed in the first oxide film 502 to expose the surface of the semiconductor substrate 501 selectively. Then, first source and drain regions 508 of impurity layers of a second conduction type (n-type) different from the first conduction type is formed in the exposed semiconductor substrate 501. A region between the source and drain regions 504 becomes a channel region 505.

Figure 12B:
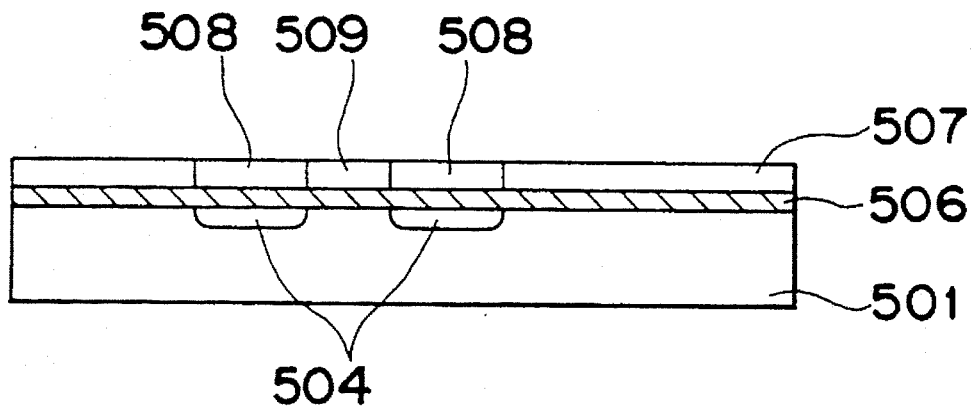

Next, as shown in FIG. 12(b), after the first oxide film 502 is removed, a second oxide film 506 as an insulator film is formed on the whole surface. Then, a semiconductor film 507 of the second conduction type including impurities of the second conduction type is applied to the second oxide film 506. Then, second source and drain regions 508 of the first conduction type are formed selectively in regions opposite to the first source and drain regions in the semiconductor film 507. A region between the source and drain regions 508 becomes a channel region 509.

Figure 12C:
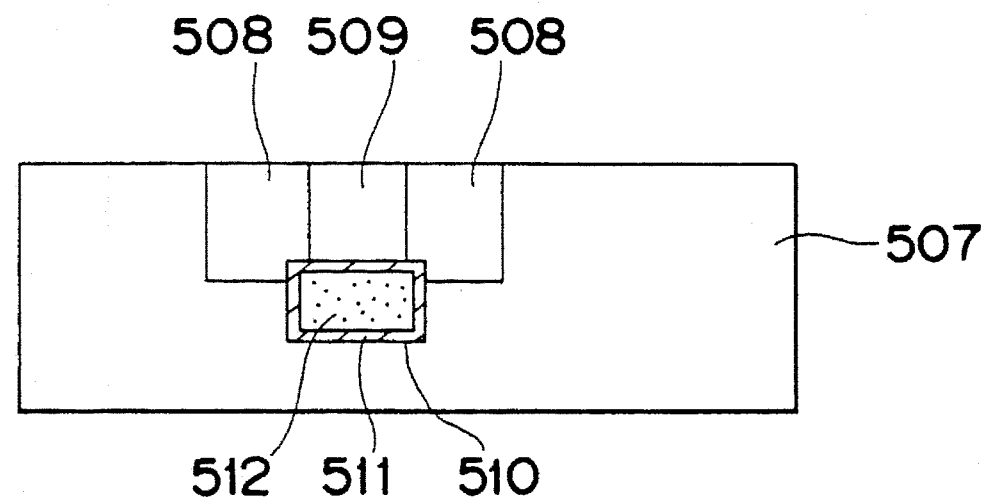

Then, as shown in a top plan view of FIG. 12(c), an opening 510 is formed with a photolithography process by removing selectively the semiconductor film 507, the second oxide film 506 and the semiconductor substrate 501. That is, in a side wall portion of the opening 510, all the channel regions 505 and 509, a part of the first source and drain regions 504, and a part of the second source and drain regions 508 are exposed. Then, an oxide film is formed by oxidizing the surface of the opening 510 thermally to form a gate oxide film 511 as a gate insulator film on the surface of the exposed channel regions 505, 509, of the first source and drain regions 504 and of the second source and drain regions 508. Then, a gate electrode 512 of a polycrystalline semiconductor film is formed adjacent to the gate oxide film 511. That is, the gate electrode is provided adjacent to the channel regions 505 and 509.

Figure 12D:
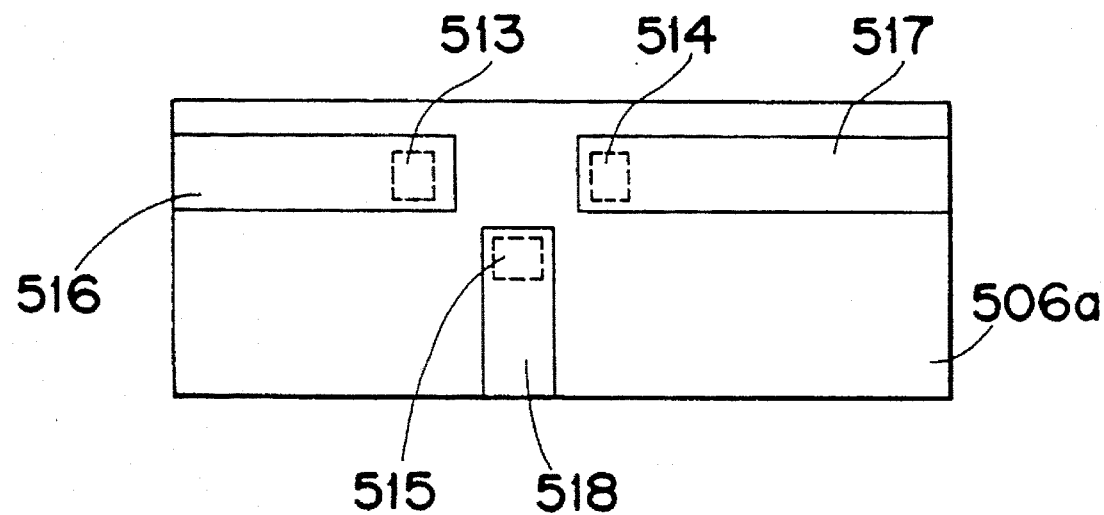

Next, as shown in FIG. 12(d), an insulator film 506a is formed on the whole surface, and openings 513, 514 for contact of the source and drain regions and an opening 515 for contact of the gate electrode are formed. Then, metal layers 516, 517, 518 are formed on the openings 513, 514, 515, respectively.

Figure 13:
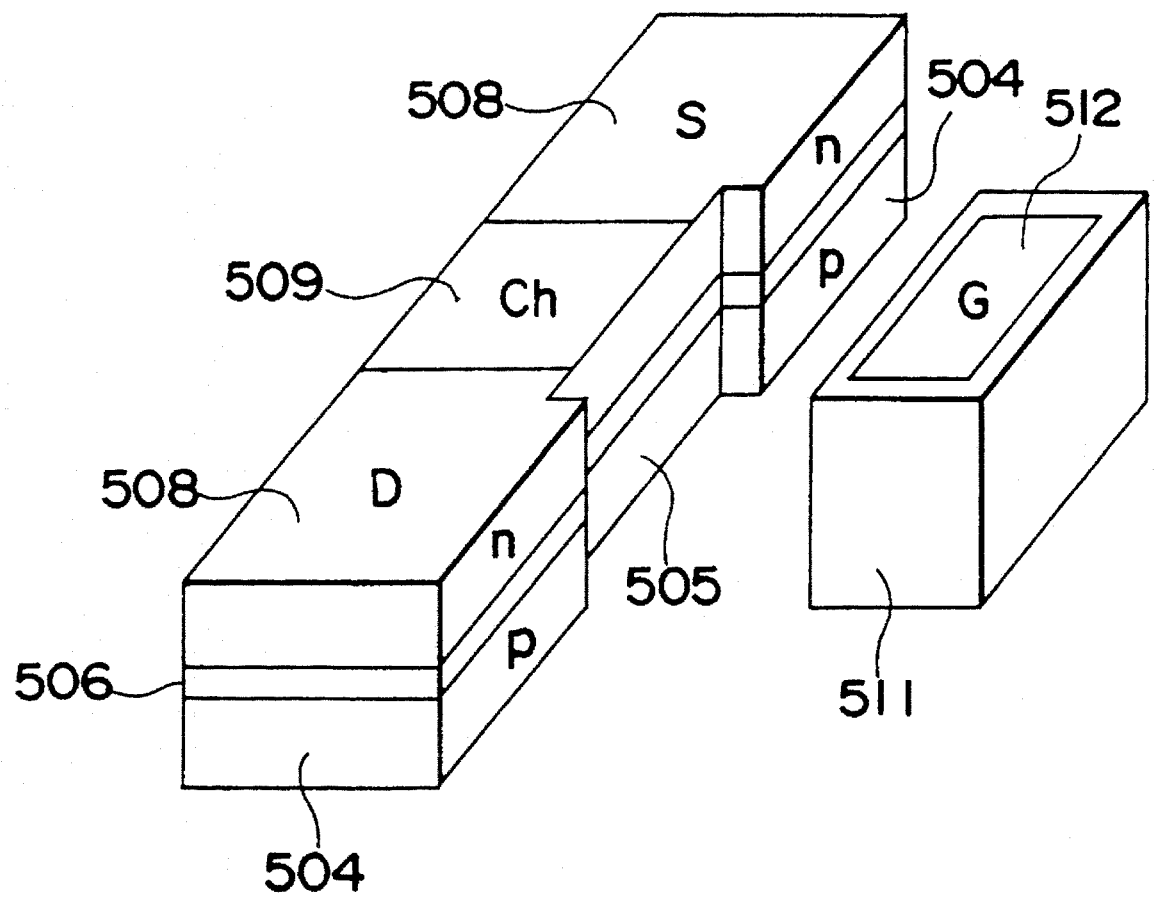
FIG. 13 is a schematic exploded view of the structure of a MOS transistor of FIGS. 12(a)–(d)

As shown schematically in an exploded view of FIG. 13, a semiconductor device manufactured as explained above comprises first source and drain regions 504 of a second conduction type, a first channel region 505 between the source and drain regions 504, an oxide film 506 as an insulating film is formed on the first source and drain regions 504 and the channel region. Second source and drain regions 508 of the first conduction type, a second channel region 509 between the second source and drain regions 508 are located above the counterparts below the insulating film 506. Further, an opening 510 is provided so as to expose the first channel region 505 and the second channel region 509 in a side wall portion of the opening 510, and a gate insulator film 511 formed in a side wall portion of the opening 510 and a gate electrode 512 of a polycrystalline semiconductor film is formed adjacent to the gate insulator film 511.

Thus, an n-channel transistor, an insulator layer and a p-channel transistor are layered vertically, while a vertical gate electrode is arranged literally beside the n- and p-channel transistors. That is, the second oxide film 506 is layered on the first source and drain regions formed on the semiconductor substrate 501. Then, a semiconductor film 507 including the second source and drain regions 508 is layered on the second oxide film 506. Further, the gate oxide film 511 and gate electrode 512 common to the first channel region 505 and the second channel region 509 are formed on a side wall portion of the opening 510 formed in the semiconductor film 507, the second oxide film 506 and the semiconductor substrate 501.

In a prior art CMOS device, a region for forming a transistor Y of a first conduction type and a region for forming a transistor X of a second conduction type are needed to be formed in the same plane, as explained above. On the contrary, in a device of the present invention, only a region for forming the first source and drain regions 508 and the first channel 505 is needed because two transistors X and Y are layered vertically. Therefore, a CMOS semiconductor device can be integrated at a high density.

Figure 14:
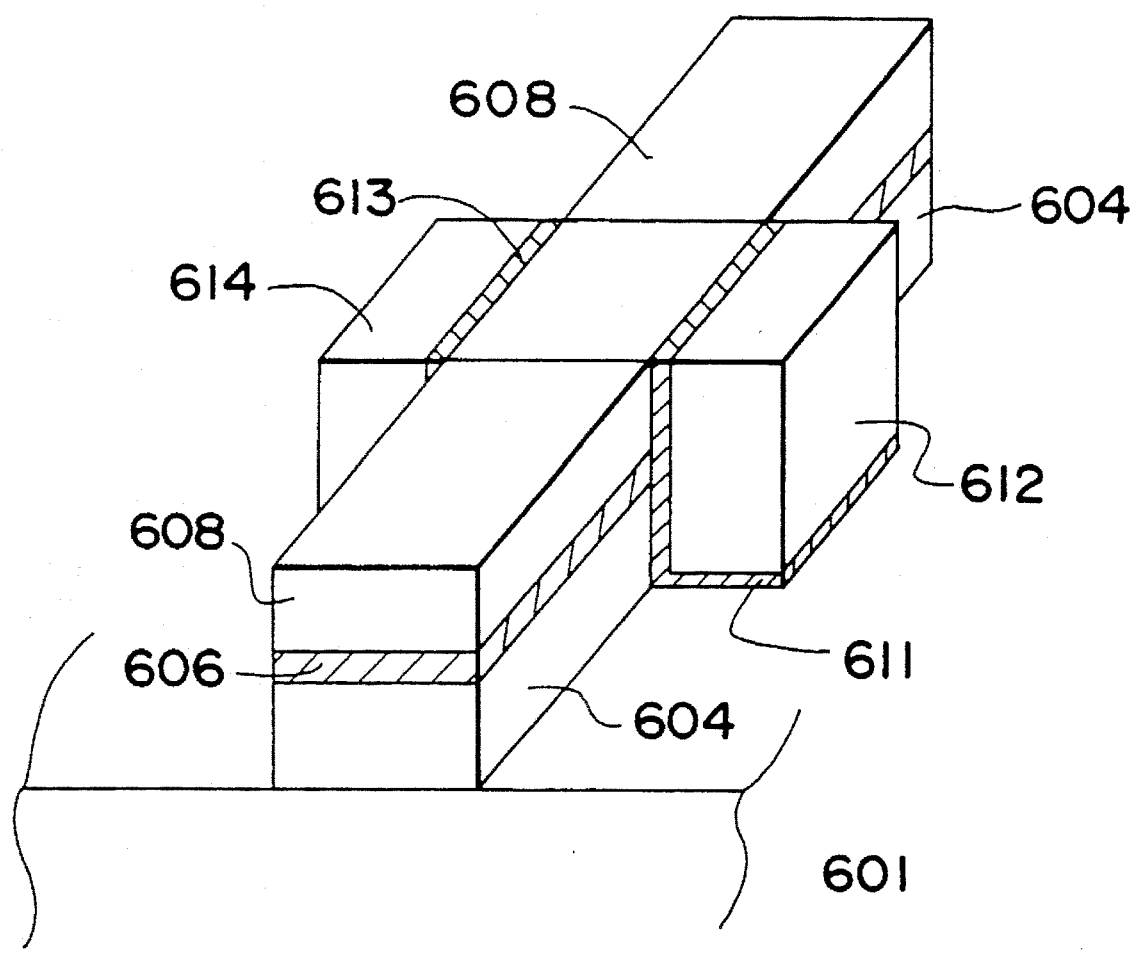
FIG. 14 is another schematic perspective view of a semiconductor device of Embodiment 6.

Further, as shown schematically in FIG. 14, two gate electrodes 612 end 614 ere provided at the two sides of a CMOS type transistor manufactured by layering two MOS transistors of different conduction types from each other similarly so FIGS. 12 and 13. This semiconductor device comprises first source and drain regions 604 of a second conduction type (for example n-type), a first channel region 605 (not shown) between the source end drain regions 604, an oxide film 506 as an insulator film applied to the first source and drain regions 604 and the channel region, second source and drain regions 608 of the first conduction type (p-type), a second channel region 609 (not shown) between the second source and drain regions 608, and the second source, channel, and drain regions are located above the counterparts below the insulator film 606. Further, two openings are provided at both sides of the source, channel and drain regions so as to expose the first channel region 605 and the second channel region 609 in a side wall portion in each opening. A gate insulating films 611,613 are formed in a side wall portion of each opening and a gate electrode 612, 614 of a polycrystalline semiconductor film are formed adjacent to each gate insulating film 612.

In this structure, a CMOS transistor may be controlled by both of the gate electrodes 612 or 614.

Therefore, when the gate length, that is, the length between source and drain, is shorter, a leakage current between source and drain has a very low value under the threshold voltage.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device, comprising:

a first insulator film formed on a substrate;

a first source region of a conduction type;

a first drain region of the conduction type;

a first channel region connecting the first source and drain regions, the first source, drain and channel region being formed in the same plane on the first insulator film with same thickness;

a second source region of the conduction type;

a second drain region of the conduction type;

a second channel region connecting the second source and drain regions, the second source, drain and channel region being formed on the first insulator film with same thickness;

a gate electrode arranged adjacent to the first and second channel regions, the gate electrode being formed in the same plane and with same thickness as the first and second channel regions; and a gate oxide film interposed between the first channel region and the gate electrode and between the second channel region and the gate electrode; and the first source, drain and channel regions, the second source, drain and channel regions, and the gate electrode are arranged above the first insulator film.

2. A semiconductor device, comprising:

a first insulator film formed on a substrate;

a first source region of a first conduction type;

a first drain region of the first conduction type;

a first channel region connecting the first source and drain regions, the first source, drain and channel region being formed in the same plane on the first insulator film with same thickness;

a second source region of a second conduction type different from the first conduction type;

a second drain region of the second conduction type;

a second channel region connecting the second source and drain regions, the second source, drain and channel region being formed on the first insulator film with same thickness;

a gate electrode arranged adjacent to the first and second channel regions, the gate electrode being formed in the same plane as the first and second channel regions; and a gate oxide film interposed between the first channel region and the gate electrode and between the second channel region and the gate electrode;

wherein the first source, drain and channel regions, the second source, drain and channel regions, and the gate electrode are arranged above the first insulator film.

3. A semiconductor device, comprising:

a first source region of a first conduction type;

a first drain region of the first conduction type;

a first channel region connecting the first source and drain regions, the first source, drain and channel region being formed in the same plane with same thickness;

an insulator film formed above the first source, channel and drain regions;

a second source region of a second conduction type different from the first conduction type formed above the insulating film;

a second drain region of the second conduction type formed above the insulating film;

a second channel region connecting the second source and drain regions, the second source, drain and channel region being formed on the first insulator film with same thickness;

a gate electrode arranged vertically adjacent to the first and second channel regions; and a gate oxide film interposed between the first channel region and the gate electrode and between the second channel region and the gate electrode.

4. A semiconductor device comprising:

a semiconductor substrate;

an insulator layer formed on the substrate;

a source region;

a drain region;

a channel region connecting the source and drain regions, wherein the channel, source and drain regions are formed on the insulator layer, and further wherein a part of the source, drain and channel regions is connected to the semiconductor substrate;

a gate electrode arranged adjacent to the channel region, the gate electrode being formed on the same insulator layer as the channel region; and a gate oxide film interposed vertically between the channel region and the gate electrode.

* * * * *